(12) United States Patent
Nakashima et al.

(10) Patent No.: US 7,471,543 B2
(45) Date of Patent: Dec. 30, 2008

(54) STORAGE DEVICE AND SEMICONDUCTOR DEVICE

(75) Inventors: Chieko Nakashima, Nagasaki (JP); Hidenari Hachino, Nagasaki (JP); Hajime Nagao, Nagasaki (JP); Nobumichi Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/530,716

(22) Filed: Sep. 11, 2006

(65) Prior Publication Data
US 2007/0070682 A1 Mar. 29, 2007

(30) Foreign Application Priority Data
Sep. 12, 2005 (JP) ............................ P2005-263513

(51) Int. Cl.
*G11C 11/00* (2006.01)
(52) U.S. Cl. ............................ 365/148; 365/55; 365/66; 365/189.07; 365/100; 365/158
(58) Field of Classification Search .................. 365/148, 365/158, 55, 66, 189.07, 100
See application file for complete search history.

(56) References Cited

U.S. PATENT DOCUMENTS

| | | | |
|---|---|---|---|
| 5,761,115 A | 6/1998 | Kozicki et al. | |
| 5,930,161 A * | 7/1999 | Sheikholeslami et al. | 365/49 |
| 6,838,720 B2 * | 1/2005 | Krieger et al. | 257/296 |
| 7,242,606 B2 * | 7/2007 | Hachino et al. | 365/148 |
| 7,259,387 B2 * | 8/2007 | Kawazoe et al. | 365/148 |
| 7,307,267 B2 * | 12/2007 | Lankhorst et al. | 257/2 |
| 2004/0160817 A1 * | 8/2004 | Rinerson et al. | 365/171 |
| 2004/0184331 A1 * | 9/2004 | Hanzawa et al. | 365/203 |
| 2005/0078505 A1 * | 4/2005 | Voshell | 365/148 |
| 2005/0167699 A1 * | 8/2005 | Sugita et al. | 257/202 |
| 2005/0248978 A1 * | 11/2005 | Chen et al. | 365/158 |
| 2006/0023488 A1 * | 2/2006 | Yasuda et al. | 365/148 |
| 2006/0028247 A1 * | 2/2006 | Hara et al. | 326/104 |
| 2006/0092685 A1 * | 5/2006 | Ootsuka et al. | 365/145 |
| 2007/0008770 A1 * | 1/2007 | Nagao et al. | 365/148 |

FOREIGN PATENT DOCUMENTS

JP   2002-536840   10/2002

OTHER PUBLICATIONS

Get Connected With Ohm's Law, Developed by IEEE as part of the IEEE Teacher In-Service Program, www.ieee.org/organization/eab/precollege, Jan. 2004, pp. 5-8.*

Phillip E. Allen et al., CMOS Analog Circuit Design, 1987, Holt, Rinehart and Winston, Inc., pp. 100-101.*

(Continued)

*Primary Examiner*—Amir Zarabian
*Assistant Examiner*—Fernando N Hidalgo
(74) *Attorney, Agent, or Firm*—Sonnenschein Nath & Rosenthal LLP

(57) ABSTRACT

A storage device includes a memory cell having a storage element having a characteristic of changing from a state of a high resistance value to a state of a low resistance value by being supplied with a voltage equal to or higher than a first threshold voltage, and changing from a state of a low resistance value to a state of a high resistance value by being supplied with a voltage equal to or higher than a second threshold voltage different in polarity from the first threshold voltage, and a circuit element connected in series with the storage element, wherein letting R be a resistance value of the storage element after writing, V be the second threshold voltage, and I be a current that can be passed through the storage element at a time of erasure, $R \geq V/I$.

16 Claims, 13 Drawing Sheets

OTHER PUBLICATIONS

W. W. Zhuang et al.; Novell Colossal Magnetoresistive Thin Film Nonvolatile Resistance Random Access Memory (RRAM); Technical Digest "IEDM"; 2002.

A. Beck et al; Reproducible switching effect in thin oxide films for memory applications; Applied Physics Letters; vol. 77, No. 1; Jul. 3, 2000.

* cited by examiner

STORAGE DEVICE AND SEMICONDUCTOR DEVICE

CROSS REFERENCES TO RELATED APPLICATIONS

The present invention contains subject matter related to Japanese Patent Application JP 2005-263513 filed with the Japanese Patent Office on Sep. 12, 2005, the entire contents of which being incorporated herein by reference.

BACKGROUND OF THE INVENTION

1. Filed of the Invention

The present invention relates to a storage device and a semiconductor device, and particularly to a storage device and a semiconductor device formed with a memory cell using a storage element that stores and retains information by a state of an electric resistance.

2. Description of the Related Art

In information devices such as computers and the like, a DRAM (Dynamic Random Access Memory) operating at a high speed and having a high density is widely used as a random access memory.

However, since DRAMs are volatile memories whose information disappears when power is turned off. Therefore nonvolatile memories whose information does not disappear are desired.

An FeRAM (ferroelectric memory), an MRAM (magnetic memory), a phase change memory, and a resistance change type memory such as a PMC (Programmable Metallization Cell), an RRAM or the like have been proposed as nonvolatile memories considered to be promising in the future.

These memories can retain information written therein for a long period of time even when no power is supplied. In addition, these memories, which are nonvolatile memories, eliminate a need for a refreshing operation, so that power consumption can be correspondingly reduced.

Further, a resistance change type nonvolatile memory such as a PMC, an RRAM or the like uses a material having a characteristic of changing a resistance value by being supplied with a voltage or a current as a storage layer for storing and retaining information, and has a relatively simple constitution in which two electrodes are provided with the storage layer interposed between the two electrodes, and a voltage or a current is applied to the two electrodes. It is therefore easy to miniaturize a storage element.

A PMC has a structure in which an ionic conductor containing a certain metal is interposed between two electrodes. Further, the metal contained in the ionic conductor is contained in one of the two electrodes, thereby using a characteristic in which an electrical property such as a resistance of the ionic conductor, a capacitance or the like changes when a voltage is applied between the two electrodes.

Specifically, the ionic conductor is composed of a solid solution of a chalcogen and a metal (for example amorphous GeS or amorphous GeSe), and one of the two electrodes contains Ag, Cu, or Zn (see JP-A-2002-536840, hereinafter referred to as Patent Document 1, for example).

As a RRAM structure, a structure has been introduced in which a polycrystalline $PrCaMnO_3$ thin film, for example, is interposed between two electrodes, and the resistance value of the $PrCaMnO_3$ recording film is greatly changed by applying a voltage pulse or a current pulse to the two electrodes (see "Novel Colossal Magnetoresistive Thin Film Nonvolatile Resistance Random Access Memory (RRAM)" written by W. W. Zhuang et al. in Technical Digest "International Electron Devices Meeting", 2002, p. 193, hereinafter referred to as Non-Patent Document 1). Voltage pulses having different polarities are applied at the time of recording (writing) information and at the time of erasing information.

As another RRAM structure, a structure has been introduced in which $SrZrO_3$ (single crystal or polycrystal) doped with a very small amount of Cr, for example, is interposed between two electrodes, and the resistance of the recording film is changed by passing current from these electrodes (see "Reproducible switching effect in thin oxide films for memory applications" written by A. Beck et al. in Applied Physics Letters, 2000, vol. 77, p. 139 to 141, hereinafter referred to as Non-Patent Document 2, for example).

Non-Patent Document 2 shows I-V characteristics of a storage layer, and shows that threshold voltages at times of recording and erasure are $\pm 0.5$ V. Even with this structure, information can be recorded and erased by applying a voltage pulse. A necessary pulse voltage is $\pm 1.1$ V, and a voltage pulse width is 2 ms. Further, high speed recording and erasing can be performed, and an operation with a voltage pulse width of 100 ns is reported. In this case, a necessary pulse voltage is $\pm 5$ V.

However, in the case of FeRAM, currently it is difficult to perform a nondestructive readout, and since a destructive readout is performed, a reading speed is slow. Moreover, the number of times of polarization inversion by reading or recording is limited, and thus there is a limitation to the number of times that FeRAM can be rewritten.

In the case of MRAM, recording needs a magnetic field, and the magnetic field is generated by a current passed through wiring. Therefore a large amount of current may be required when recording is performed.

A phase change memory performs recording by applying voltage pulses having a same polarity and different magnitudes. However, the phase change memory causes switching according to a temperature, and is therefore sensitive to a change in ambient temperature.

In the case of the PMC described in Patent Document 1, the crystallization temperature of amorphous GeS or amorphous GeSe is approximately 200° C., and the characteristics of the PMC are degraded when the ionic conductor is crystallized. Thus, the PMC may not endure a high temperature in a process of actually producing a memory element, for example a process of forming a CVD insulating film, a protective film or the like.

Each material for a storage layer proposed in the structure of the RRAMs described in Non-Patent Document 1 and Non-Patent Document 2 is a crystalline material. Therefore problems occur in that, for example, a heat treatment at approximately 600° C. has to be performed, it is very difficult to manufacture a single crystal of the proposed materials, and miniaturization is difficult due to effects of a grain boundary when a polycrystal is used.

Further, performing the recording or erasure of information by applying a pulse voltage in the above-mentioned RRAM is proposed. However, with the proposed structure, the resistance value of the storage layer after recording changes depending on the pulse width of the applied pulse voltage. Moreover, the fact that the resistance value after recording is thus dependent on the recording pulse width indirectly indicates that the resistance value will also change when the same pulse is repeatedly applied.

For example, in the above-mentioned Non-Patent Document 1, it is reported that when pulses having the same polarity are applied, the resistance value after recording changes greatly depending on pulse width. When the pulse width is small, that is, 50 ns or less, a rate of resistance change by recording is low. When the pulse width is large, that is, 100 ns or more, instead of being saturated to a constant value, the resistance value approaches a resistance value before recording as the pulse width is increased. Non-Patent Document 1 introduces characteristics of a memory structure in which a storage layer and a MOS transistor for access control are connected in series with each other and are disposed in the form of an array. In Non-Patent Document 1, it is reported that the resistance value of the storage layer after recording changes depending on the pulse width when the pulse width is changed in a range of 10 ns to 100 ns. When the pulse width is further increased, it is presumed from the characteristics of the storage layer that the resistance decreases again.

That is, the resistance value after recording in the RRAM is dependent on the magnitude and the pulse width of the pulse voltage, and therefore the resistance value after recording is varied when there are variations in the magnitude and the pulse width of the pulse voltage.

Accordingly, when the pulse voltage is shorter than about 100 ns, the rate of resistance change by recording is low, and thus variations in the resistance value after recording tend to produce effects. It is therefore difficult to perform the recording stably.

Accordingly, when recording is to be performed with such a short pulse voltage, a process of confirming (verifying) contents of information needs to be performed after the recording in order to perform the recording surely.

For example, a process of reading and confirming the contents of information (the resistance value of a storage layer) already recorded in a storage element is performed before recording, and the recording is performed in such a manner as to correspond to relation between the confirmed contents (resistance value) and contents to be recorded from now on (resistance value). Alternatively, for example, a process of reading and confirming the contents of information recorded in a storage element is performed after recording, and when the contents of information are different from a desired resistance value, re-recording is performed to correct the contents of information to the desired resistance value.

Thus, a long time is taken for recording, and it is difficult to perform overwriting of data or the like at a high speed, for example.

In order to solve the above-described problems, a storage device is proposed, the storage device including a memory cell formed by a storage element having a characteristic of changing a resistance value by applying a voltage equal to or higher than a threshold voltage between both ends of the storage element and a MOS transistor connected in series with the storage element, wherein when a voltage applied between both ends of the storage element and the MOS transistor is higher than a certain voltage which is higher than the threshold voltage, a combined resistance value of the storage element and the MOS transistor in the memory cell after the resistance value of the storage element is changed from a high state to a low state is a substantially constant value irrespective of magnitude of the voltage (see Japanese Patent Application No. 2004-22121, hereinafter referred to as Patent Document 2, for example). Such a storage device achieves stable recording, and shortens a time taken for recording information.

SUMMARY OF THE INVENTION

When an operation of changing the storage element from a state of a high resistance value to a state of a low resistance value is defined as writing, and an operation of changing the storage element from a state of a low resistance value to a state of a high resistance value is defined as erasure, a range of resistance values of the storage element after the writing needs to be defined in order to realize writing and erasure in the storage device described in Patent Document 2. When the resistance value of the storage element after the writing satisfies a certain condition, the erasure of the storage element after the writing is made possible.

The present invention has been made in view of the above, and it is desirable to provide a storage device and a semiconductor device that can perform stable recording, shorten a time taken for recording information, and erase a storage element after writing.

According to an embodiment of the present invention, there is provided a storage device including: a memory cell having a storage element having a characteristic of changing from a state of a high resistance value to a state of a low resistance value by being supplied with a voltage equal to or higher than a first threshold voltage, and changing from a state of a low resistance value to a state of a high resistance value by being supplied with a voltage equal to or higher than a second threshold voltage different in polarity from the first threshold voltage, and a circuit element connected in series with the storage element; wherein letting R be a resistance value of the storage element after writing, V be the second threshold voltage, and I be a current that can be passed through the storage element at a time of erasure, $R \geq V/I$.

Letting R be the resistance value of the storage element after writing, V be the second threshold voltage, which is a minimum voltage necessary for erasing the storage element, and I be the current that can be passed through the storage element at a time of erasure, $R \geq V/I$, whereby the resistance value of the storage element before the erasure is V/I or higher. It is therefore possible to apply a voltage equal to or higher than the second threshold voltage to the storage element at the time of the erasure operation, and thereby erase the storage element after writing.

Incidentally, methods for controlling the resistance value R of the storage element after writing to $R \geq V/I$ include for example a method of limiting an amount of current applied to the storage element.

According to an embodiment of the present invention, there is provided a semiconductor device including: a storage device including a memory cell, the memory cell having a storage element having a characteristic of changing from a state of a high resistance value to a state of a low resistance value by being supplied with a voltage equal to or higher than a first threshold voltage, and changing from a state of a low resistance value to a state of a high resistance value by being supplied with a voltage equal to or higher than a second threshold voltage different in polarity from the first threshold voltage, and a circuit element connected in series with the storage element; and writing control means for, letting R be a resistance value of the storage element after writing, V be the second threshold voltage, and I be a current that can be passed through the storage element at a time of erasure, making $R \geq V/I$.

The semiconductor device includes the writing control means for, letting R be the resistance value of the storage element after writing, V be the second threshold voltage, which is a minimum voltage necessary for erasing the storage element, and I be the current that can be passed through the storage element at the time of erasure, making $R \geq V/I$, whereby the resistance value of the storage element before the erasure is V/I or higher. It is therefore possible to apply a voltage equal to or higher than the second threshold voltage to the storage element at the time of the erasure operation, and thereby erase the storage element after writing.

The storage device and the semiconductor device according to the embodiments of the present invention as described above can perform stable recording, shorten a time taken for recording information, and erase the storage element after writing.

DETAILED DESCRIPTION OF THE PREFERRED EMBODIMENTS

A preferred embodiment of the present invention will hereinafter be described with reference to the drawings, for understanding of the present invention. Incidentally, in the present embodiment, a storage device is formed by using a resistance change type storage element (hereinafter referred to as a memory element) in a memory cell, and the memory element in this case is an example of a storage element.

Figure 1:
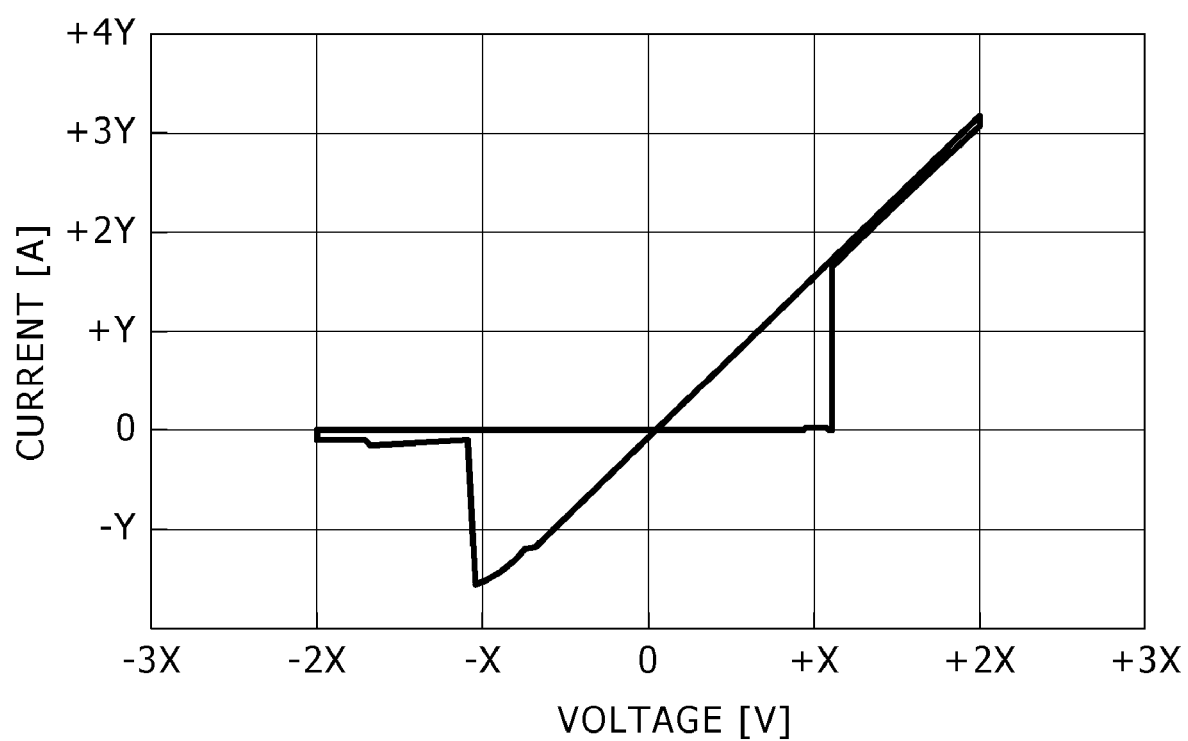
FIG. 1 is a graph showing current-voltage (I-V) changes of a memory element used in an example of a storage device to which the present invention is applied.

FIG. 1 is a graph showing current-voltage (I-V) changes of a memory element used in an example of a storage device to which the present invention is applied.

Incidentally, the memory element having the I-V characteristics as shown in FIG. 1 includes a storage element formed by interposing a storage layer between a first electrode and a second electrode, for example (between a lower electrode and an upper electrode, for example), the storage layer being composed of an amorphous thin film such as a rare-earth oxide film, for example.

This memory element in an initial state has a high resistance value (for example 1 M$\Omega$ or more), so that current does not flow through the memory element easily. However, when a voltage of +1.1 X [V] (for example +0.5 V) or higher in FIG. 1 is applied, the current is increased sharply, and the resistance value is lowered (for example a few k$\Omega$). Then, the memory element is changed to ohmic characteristics, in which the current flows in proportion to voltage, that is, the resistance value becomes a constant value. Thereafter the memory element retains the resistance value (low resistance value) even when the voltage is returned to 0 V.

Hereinafter, this operation will be referred to as writing, and this state will be referred to as conduction. That is, an operation of changing the memory element from a high resistance state to a low resistance state will be referred to as writing. The voltage applied at this time will be referred to as a writing voltage threshold value.

Next, when a voltage of opposite polarity to that in the writing is applied to the memory element, and the applied voltage is increased, at −1.1 X [V] (for example −0.5 V) in FIG. 1, the current flowing through the memory element is decreased sharply, that is, the resistance value is increased sharply to be changed to the same high resistance value (for example 1 M$\Omega$ or more) as in the initial state. Thereafter the memory element retains the resistance value (high resistance value) even when the voltage is returned to 0 V.

Hereinafter, this operation will be referred to as erasure, and this state will be referred to as insulation. That is, an operation of changing the memory element from a low resistance state to a high resistance state will be referred to as erasure. The voltage applied at this time will be referred to as an erasure voltage threshold value.

Thus applying the positive voltage and the negative voltage to the memory element can reversibly change the resistance value of the memory element in a range of a few k$\Omega$ to about 1 M$\Omega$. While no voltage is applied to the memory element, that is, while the voltage is 0 V, the memory element can assume two states, that is, the conduction state and the insulation state. One-bit data can be stored by associating these states with data 1 and 0.

Incidentally, the applied voltage in FIG. 1 is in a range of −2 X to +2 X; however, the memory element used in one example of a storage device to which the present invention is applied hardly varies the resistance value even when the applied voltage is made higher than the range.

Figure 2A:
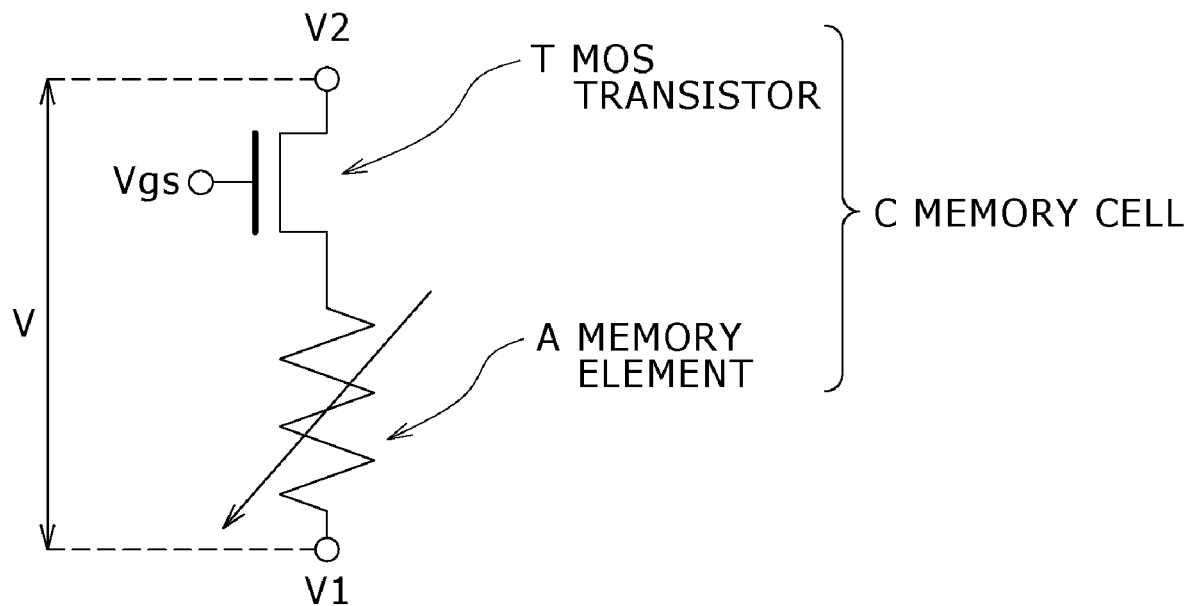
FIGS. 2A and 2B are circuit diagrams of assistance in explaining a memory cell used in one example of a storage device to which the present invention is applied.
Figure 2B:
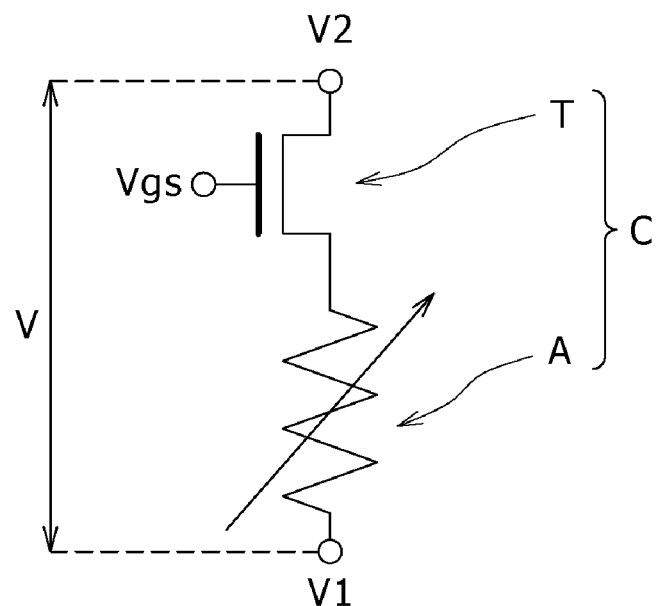

FIGS. 2A and 2B are circuit diagrams of assistance in explaining a memory cell used in one example of a storage device to which the present invention is applied. Memory cells C shown in the figures are formed by connecting a MOS transistor T in series with a memory element A. Thereby the MOS transistor not only acts as a switching element for selecting the memory element to be accessed, but also acts as a load on the memory element at a time of writing. Incidentally, the MOS transistor is an example of a circuit element connected in series with a storage device.

A terminal voltage V1 is applied to a terminal of the memory element which terminal is on an opposite side from a terminal of the memory element which terminal is connected to the MOS transistor. A terminal voltage V2 is applied to one terminal (for example a terminal on a source side) of the MOS transistor which terminal is on an opposite side from a terminal of the MOS transistor which terminal is connected to the memory element. A voltage Vgs is applied to the gate of the MOS transistor.

Since the terminal voltages V1 and V2 are respectively applied to the two terminals of the memory element and the MOS transistor forming the memory cell, a potential difference V (=|V2−V1|) occurs between the two terminals.

It is desirable that the resistance value at a time of writing of the memory element be equal to or higher than the on resistance of the MOS transistor. This is because when the resistance value of the memory element is low at a time of a start of erasure, most of the potential difference applied between the terminals is applied to the MOS transistor, resulting in a power loss. Therefore the applied voltage cannot be efficiently used to change the resistance of the memory element. Incidentally, at a time of a start of writing, the resistance value of the memory element is sufficiently high, and therefore most of the voltage is applied to the memory element, thus presenting no such problem.

Figure 3:
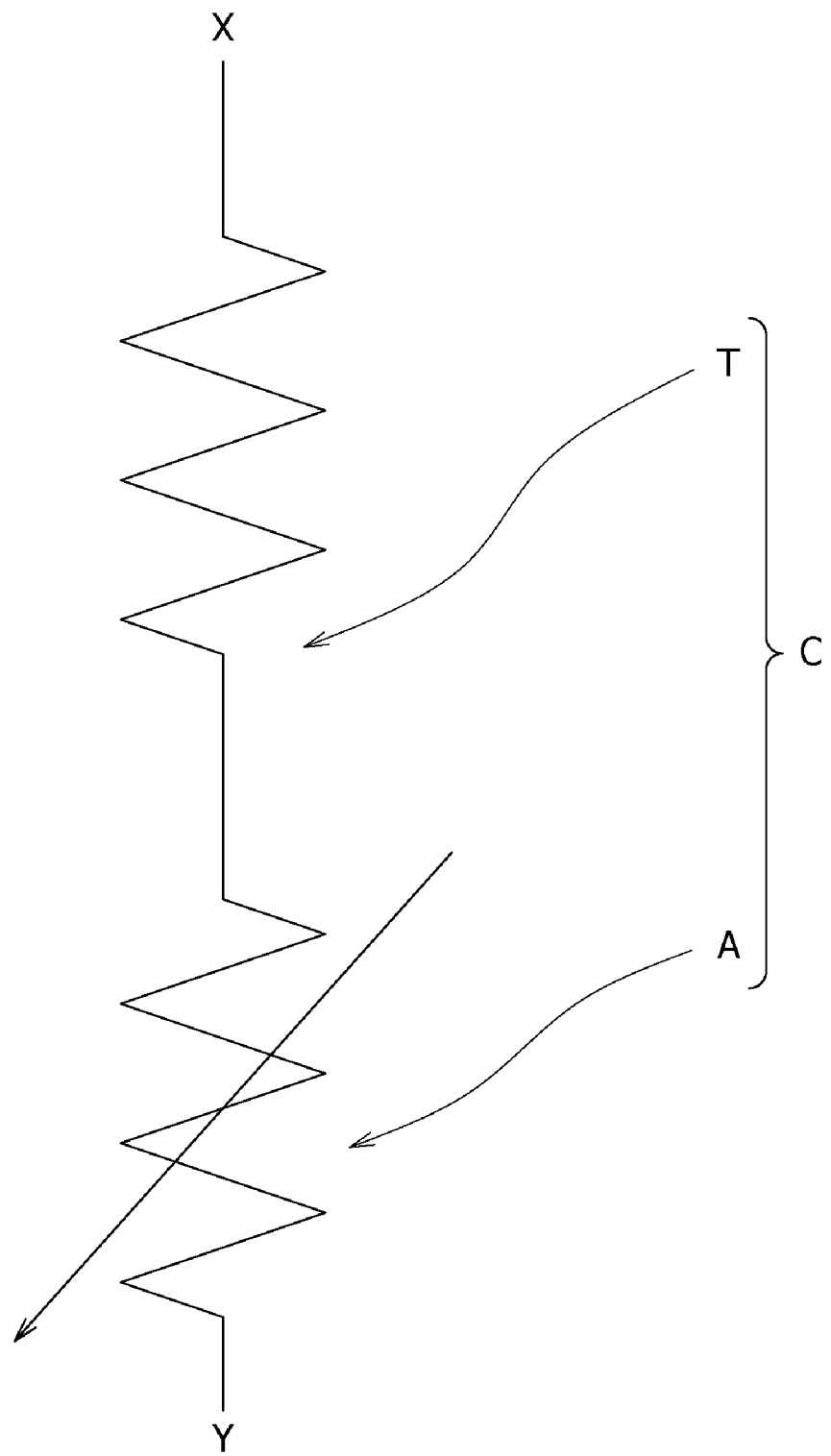
FIG. 3 is a circuit diagram of assistance in explaining the concept of a phenomenon in which the resistance of a memory element immediately after writing is determined by a current flowing through the memory element.
Figure 4:
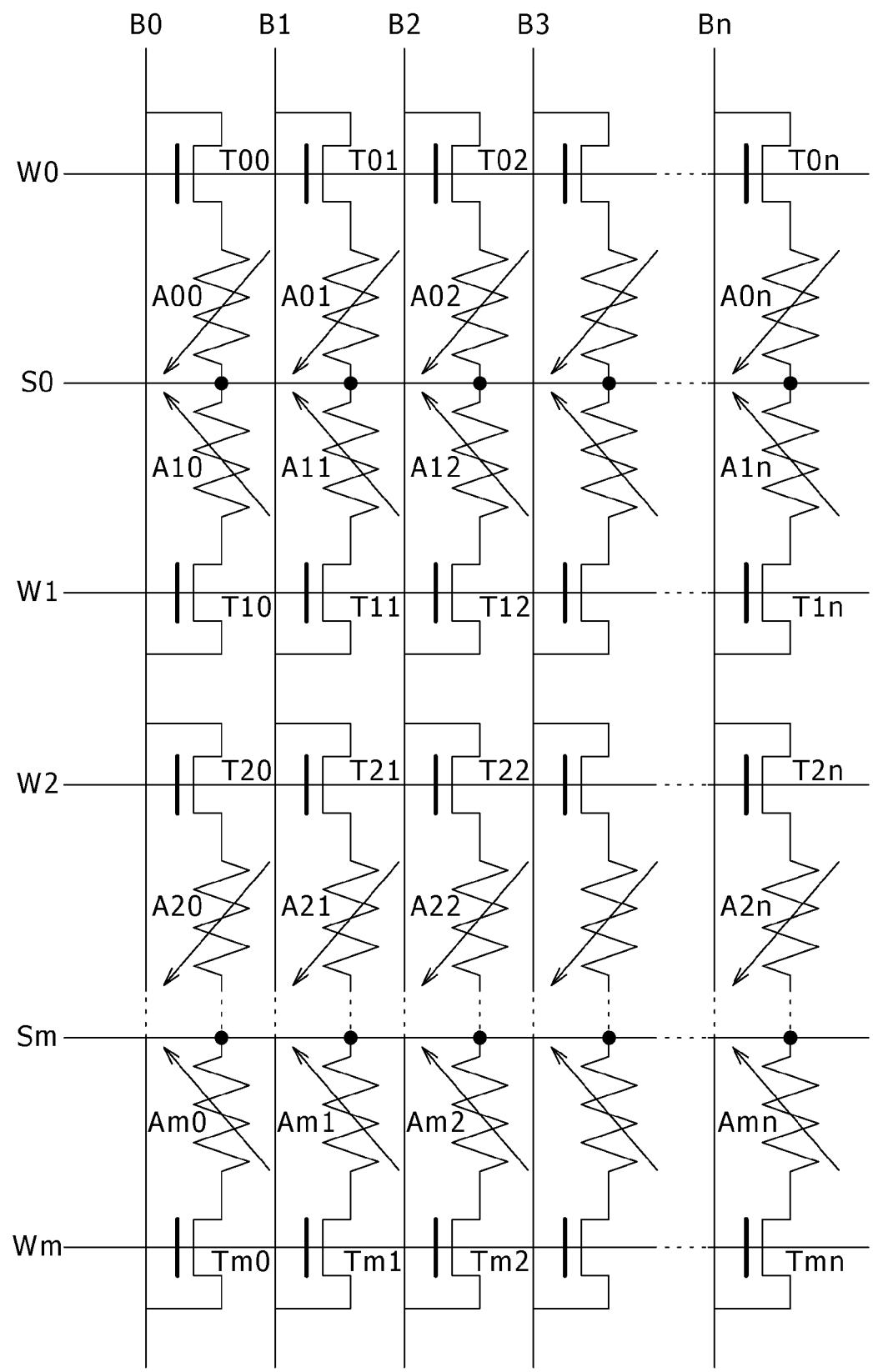
FIG. 4 is a circuit diagram (1) of assistance in explaining an example of a storage device to which the present invention is applied.
Figure 5:
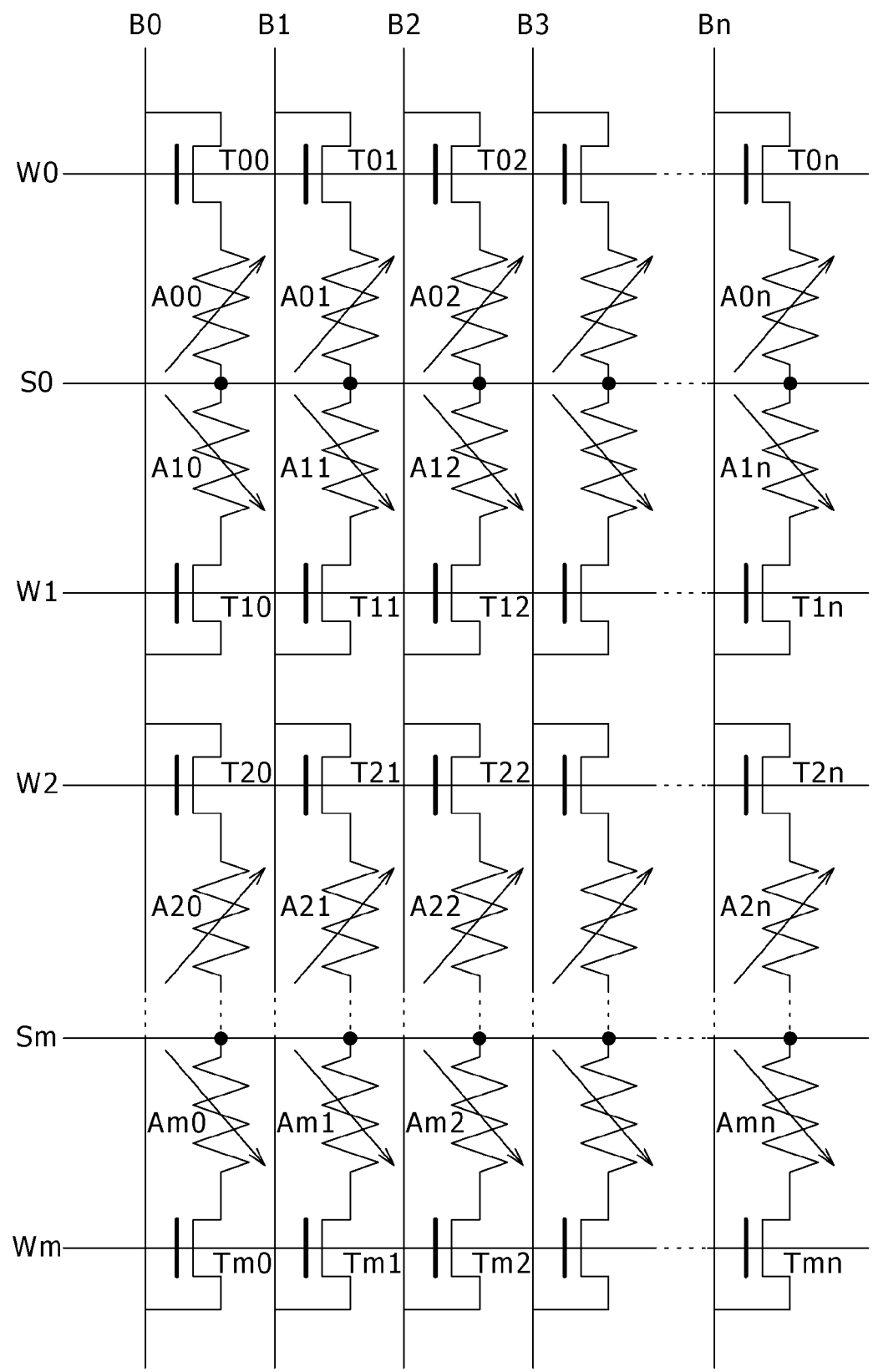
FIG. 5 is a circuit diagram (2) of assistance in explaining an example of a storage device to which the present invention is applied.
Figure 6:
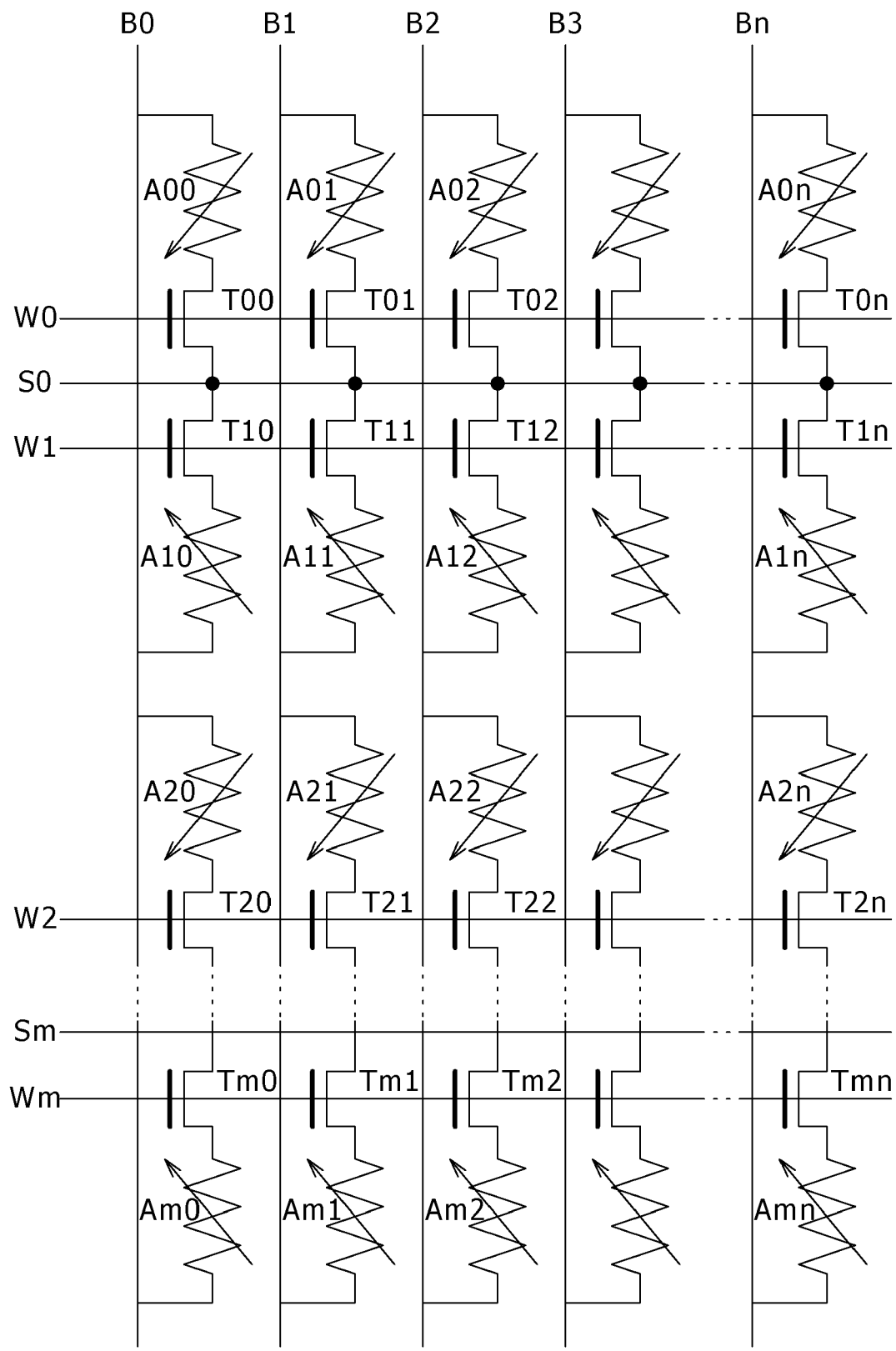
FIG. 6 is a circuit diagram (3) of assistance in explaining an example of a storage device to which the present invention is applied.
Figure 7:
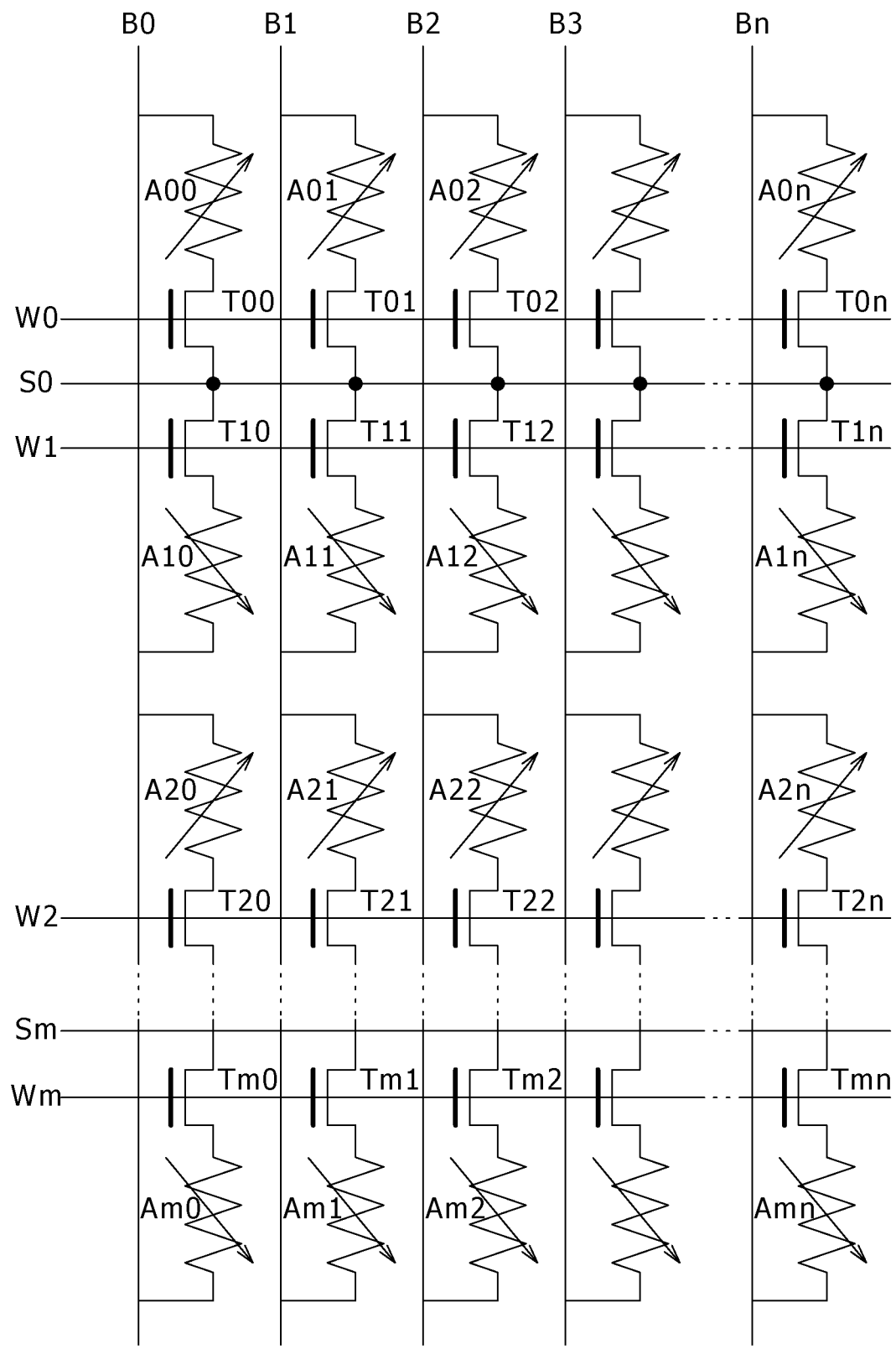
FIG. 7 is a circuit diagram (4) of assistance in explaining an example of a storage device to which the present invention is applied.

It is known by experiment that the resistance of the memory element used in the embodiment of the present invention immediately after writing is not a value unique to the element, but is determined by a current flowing through the memory element immediately after writing. FIG. 3 is a circuit diagram of assistance in explaining the concept of a phenomenon in which the resistance of a memory element immediately after writing is determined by a current flowing through the memory element, the memory element being connected in series with a load resistance. Suppose that the memory element is in an insulation state, that is, in a state in which the resistance value of the memory element is 1 MΩ or more.

When 0.5 V as a writing voltage threshold value is applied in a writing direction (a direction of moving from a symbol X to a symbol Y) between two terminals denoted by the symbols X and Y in FIG. 3, since the resistance value of the memory element is sufficiently higher than the value of the load resistance connected in series with the memory element, a voltage of 0.5 V is applied across the memory element, and consequently the memory element is changed from the insulation state to a conduction state.

It is known experimentally that the voltage across the memory element immediately after writing is fixed (about 0.2 V, for example) regardless of the value of the load resistance connected in series with the memory element. Thus, in a case [1] of a load resistance value of 1 kΩ, a current of (0.5 V−0.2 V)/1 kΩ=0.3 mA flows, and the resistance value of the memory element is 0.2 V/0.3 mA=0.67 kΩ. In a case [2] of a load resistance value of 10 kΩ, a current of (0.5 V−0.2 V)/10 kΩ=0.03 mA flows, and the resistance value of the memory element is 0.2 V/0.03 mA=6.7 kΩ.

Thus, the resistance value of the memory element immediately after writing is determined by the current flowing through the memory element, and the once determined resistance value after the writing is unchanged and constant unless an erasure voltage threshold value (an opposite voltage direction from writing) is exceeded.

Incidentally, such a phenomenon does not occur in the case of erasure, and an insulation resistance value is changed to a few ten kΩ to 1 MΩ or more irrespective of the writing resistance value.

Two kinds of memory cell configuration shown in FIG. 2A and FIG. 2B are conceivable on the basis of the polarity of the memory element and the MOS transistor.

Incidentally, arrows of the memory cells in FIG. 2A and FIG. 2B denote polarity, and indicate that when a voltage is applied in the directions of the arrows, the memory elements are changed from the insulation state to the conduction state, that is, a writing operation is performed.

FIGS. 4 to 7 are circuit diagrams of assistance in explaining an example of a storage device to which the present invention is applied. Memory arrays shown in FIGS. 4 to 7 are formed by arranging memory cells shown in FIG. 2A or 2B in the form of a matrix. Four kinds of memory array configuration shown in FIG. 4, FIG. 5, FIG. 6, and FIG. 7 are conceivable on the basis of the polarity of the memory element and arrangement relation between the memory element and the MOS transistor.

The storage devices shown in FIGS. 4 to 7 are formed by arranging memory cells in the form of a matrix with (m+1) rows and (n+1) columns. A memory cell is formed by connecting one terminal of a memory element to a MOS transistor, as shown in FIG. 2A or 2B.

The gate of the MOS transistor T (T00 to Tmn) is connected to a word line W (W0 to Wm). Another terminal of the MOS transistor is connected to a bit line B (B0 to Bn). Another terminal of the memory element is connected to a source line S (S0 to Sm).

Incidentally, forming an ion distributing layer constituting the memory element as an ion distributing layer common to all memory cells without patterning the ion distributing layer in each memory cell eliminates a need for separation of a memory element for each one-bit cell, allows patterning accuracy in manufacturing the memory element to be relaxed, and improves the manufacturing yield of the memory element.

Figure 8:
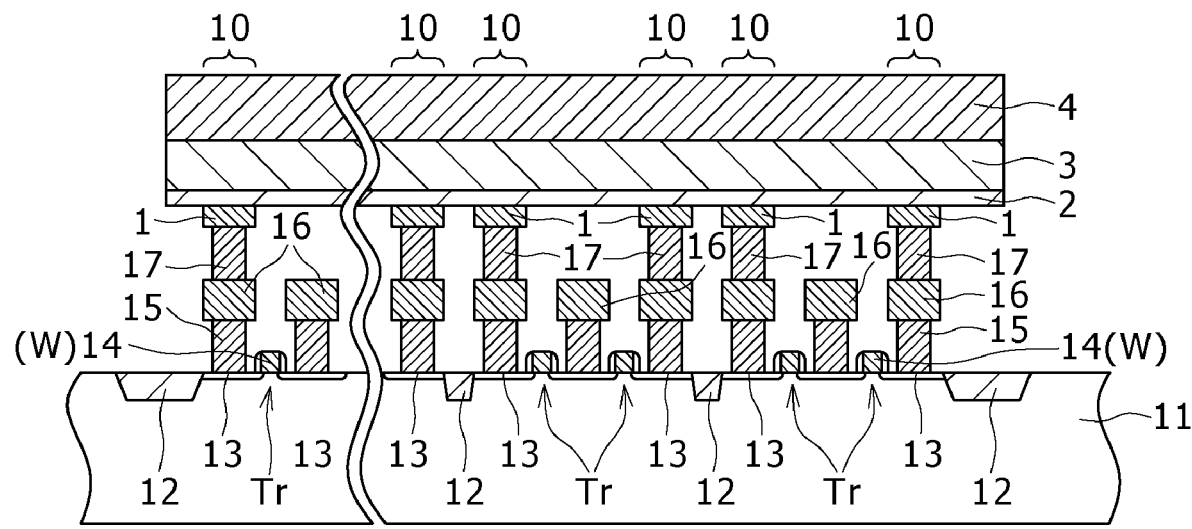
FIG. 8 is a schematic sectional view of assistance in explaining one example of a storage device to which the present invention is applied.

Accordingly, in one example of a storage device to which the present invention is applied, as shown in FIG. 8, memory elements 10 forming memory cells are arranged in the form of a matrix and formed by interposing a high-resistance film 2 and an ion source layer 3 between a lower electrode 1 and an upper electrode 4, the high-resistance film and the ion source layer forming a storage layer for storing information.

The ion source layer 3 contains one or more elements (metallic elements) selected from Ag, Cu, and Zn and one or more elements (chalcogen elements) selected from S, Se, and Te. The metallic elements are ionized, thereby changing the resistance value of the memory element. That is, the metallic elements (Ag, Cu, and Zn) are an ion source.

The high-resistance film 2 is formed by using a material having a high resistivity than the ion source layer, for example an insulator or a semiconductor. Specifically, it is possible to use materials such for example as silicon oxide, silicon nitride, rare-earth oxide film, rare-earth nitride film, amorphous silicon, amorphous germanium, and amorphous chalcogen.

Specifically, as the above-described ion source layer, a CuTeGeGd film, for example, can be used. Though the resistivity of the CuTeGeGd film differs depending on the composition of the CuTeGeGd film, it is easy to lower the resistance of the CuTeGeGd film, at least as compared with a case where S or Se is used as a chalcogen, because Cu, Te, and Gd are metallic elements.

Among amorphous chalcogen thin films, GeTe has a very low resistivity of about $1\times10^4$ Ωcm. On the other hand, for example, GeSe has a resistivity of about $1\times10^{13}$ Ωcm, and GeSTe has a resistivity of about $1\times10^{11}$ Ωcm (see p. 76 in the May 1990 issue of "Functional Materials").

Thus, the resistance can be lowered by including metals such as Cu and Gd or the like in a material having GeTe as a base material or a material containing Te. The resistance value of a CuTeGeGd film having a thickness of 20 nm and a cell area of 0.4 μm² can be about 100Ω or lower.

On the other hand, the resistance value of a gadolinium oxide film used as the high-resistance film 2 is high, and can be easily 100 kΩ or higher, or further 1 MΩ even with a small film thickness.

Each memory element in the configuration of FIG. 8 is formed above a MOS transistor Tr formed on a semiconductor substrate 11.

The MOS transistor Tr includes source/drain regions 13 and a gate electrode 14 formed in a region separated by a device separating layer 12 within the semiconductor substrate 11. A sidewall insulating layer is formed on the wall surface of the gate electrode 14.

The gate electrode 14 also serves as a word line W as one piece of address wiring of the storage device.

One of the source/drain regions 13 of the MOS transistor Tr and the lower electrode of the memory element are electrically connected to each other via a plug layer 15, a metallic wiring layer 16, and a plug layer 17.

The other source/drain region 13 of the MOS transistor Tr is connected to the metallic wiring layer 16 via the plug layer 15. The metallic wiring layer 16 is connected to a bit line as another piece of address wiring of the storage device.

Description will be made below of a feature that the resistance value of the memory element after writing has to be a predetermined resistance value or higher in order for the storage device formed as described above to erase the memory element after writing.

Let Vin (Verase) be a voltage applied to the whole of the memory cell at a time of an erasure operation, Vcell be a divided voltage applied to the memory element, the divided voltage applied to the memory element being a part of the voltage applied to the whole of the memory cell, and Vth_erase be the erasure voltage threshold value of the memory element. Further, let Vmos be a divided voltage applied to the MOS transistor, the divided voltage applied to the MOS transistor being a part of the voltage applied to the whole of the memory cell, Vword be the gate voltage of the MOS transistor, Vth_mos be the threshold value voltage of the MOS transistor, Icell be a current flowing through the memory element, and Imos be a current flowing through the MOS transistor.

As preconditions for erasure operation, the memory element before erasure is in a low-resistance (writing) state (first condition), and a voltage equal to or higher than the erasure voltage threshold value needs to be applied to the memory element (second condition).

From the first condition, the resistance of the memory element before erasure being zero (conduction state) or a finite value, and considering that the voltage Vcell has a relation Vcell=Icell×Rcell, (1) a method of increasing the voltage Vcell by increasing the current Icell or (2) a method of increasing the voltage Vcell by increasing the resistance Rcell are considered in order to make the voltage Vcell sufficiently high to satisfy the second condition.

However, the memory element and the MOS transistor are connected in series with each other, and an operating current in the MOS transistor is limited, that is, there is a lower limit to the on resistance of the MOS transistor, so that the current Icell is limited to the current Imos. Thus, to make the voltage Vcell sufficiently high, the resistance Rcell has to be a predetermined resistance value or higher.

This will be further described in separate cases of [1] the voltage Vin being applied to one terminal of the memory element and [2] the voltage Vin being applied to one terminal of the MOS transistor.

[1] Case of Voltage Vin Being Applied to One Terminal of Memory Element

Figure 9A:
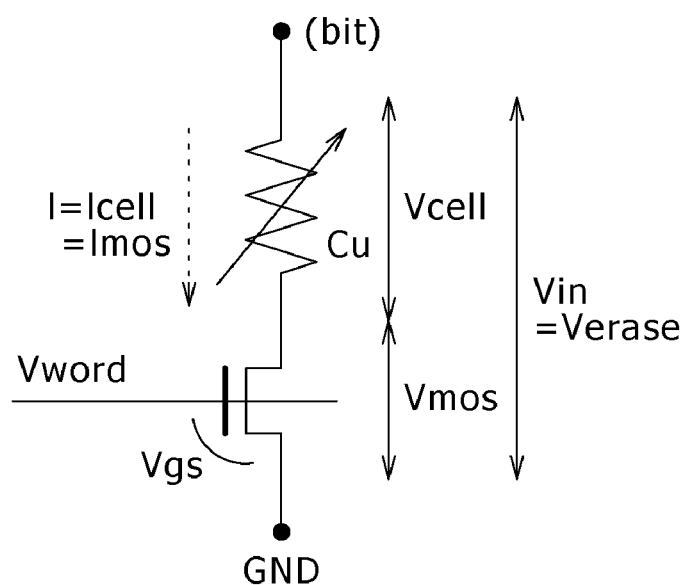
FIG. 9A is a schematic diagram (1) of assistance in explaining an operation of erasing a memory element.
Figure 9B:
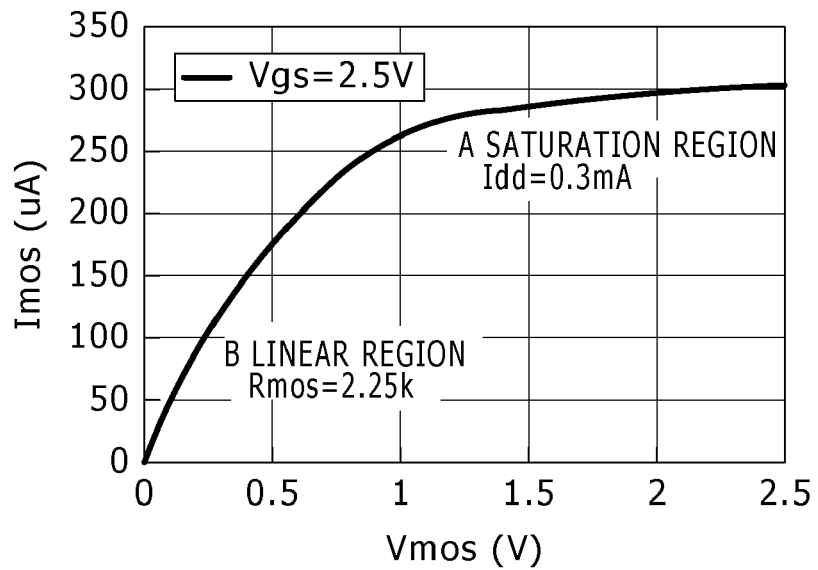
FIG. 9B is a graph showing a relation between voltage Vmos and current Imos.

As shown in FIG. 9A, when the voltage Vin is applied to one terminal of the memory element, and a ground potential GND is applied to one terminal of the MOS transistor, the gate voltage Vword is a GND-to-gate voltage Vgs, the gate voltage Vword is not affected by the voltage Vcell, and the voltage Vmos and the current Imos have a relation as shown in FIG. 9B.

[1-1] Operation in Saturation Region

When the MOS transistor operates in a saturation region indicated by a symbol A in FIG. 9B, the current Icell becomes a saturation current of the MOS transistor, the MOS transistor is thus a constant-current source, and a relation Vcell=Rcell×Imos holds. To erase the memory element, a relation Vcell≧Vth_erase has to be hold. From the relation Vcell=Rcell×Imos, it is understood that to realize the erasure operation, a relation Rcell≧Vth_erase/Imos has to be satisfied.

Incidentally, it is also understood that when the current Imos may be considered constant, the resistance Rcell needs to be higher than a certain value determined by the erasure voltage threshold value and that the erasure does not necessarily succeed when the voltage Vin is a high voltage.

[1-2] Operation in Non-Saturation Region

On the other hand, when the MOS transistor operates in a non-saturation region indicated by a symbol B in FIG. 9B, voltages applied to the memory element and the MOS transistor are defined as respective resistance-divided voltages. For the erasure divided voltage applied to the memory element, a relation Vcell=Rcell/(Rcell+Rmos)×Vin holds. As described above, to erase the memory element, the relation Vcell≧Vth_erase has to be hold. From the relation Vcell=Rcell/(Rcell+Rmos)×Vin, it is understood that to realize the erasure operation, a relation Rcell≧Vth_erase/Vin× (Rcell+Rmos), that is, a relation Rcell≧Vth_erase/Imos has to be satisfied.

Figure 9C:
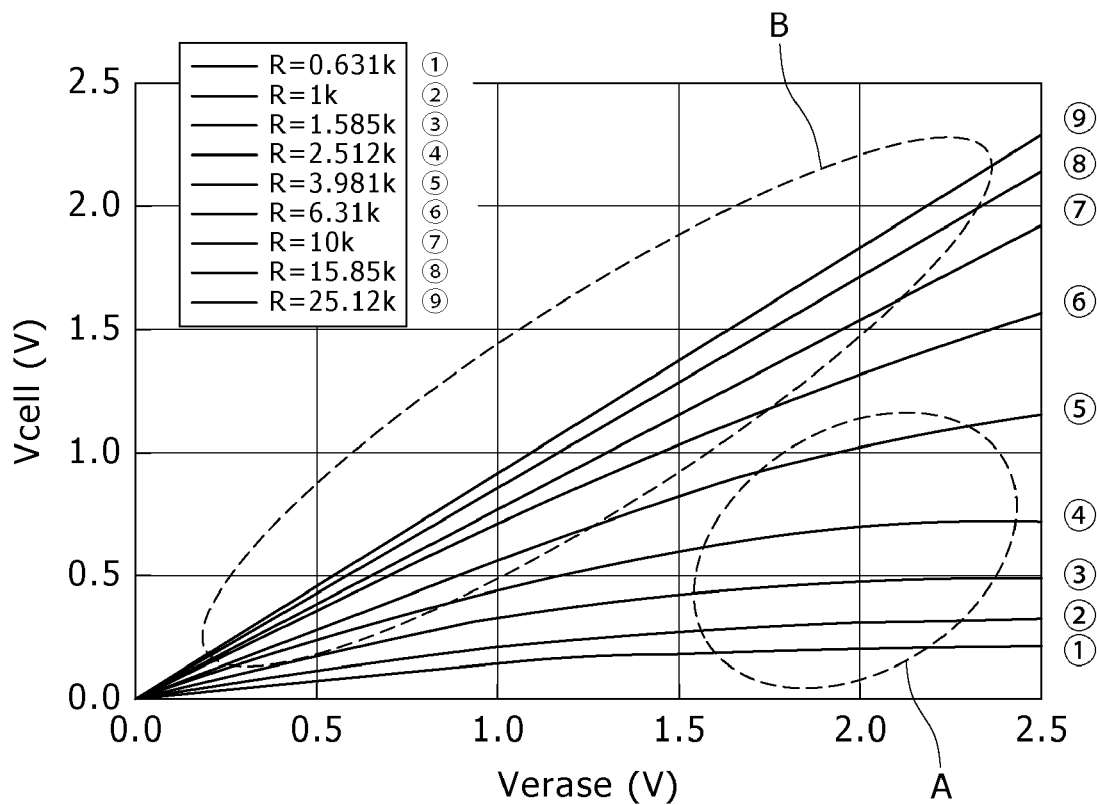
FIG. 9C is a graph (1) showing relations between voltage Verase and voltage Vcell.

FIG. 9C shows relations between the voltage Verase and the voltage Vcell when the resistance value of the memory element after writing is 0.631 kΩ, 1 kΩ, 1.585 kΩ, 2.512 kΩ, 3.981 kΩ, 6.31 kΩ, 10 kΩ, 15.85 kΩ, and 25.12 kΩ. Incidentally, a symbol A in FIG. 9C denotes the saturation region of the MOS transistor, and a symbol B in FIG. 9C denotes the non-saturation region of the MOS transistor.

It is understood from FIG. 9C that when a predetermined voltage Vin is applied, the higher the resistance value of the memory element after writing, the higher the voltage Vcell.

[2] Case of Voltage Vin Being Applied to One Terminal of Mos Transistor

Figure 10A:
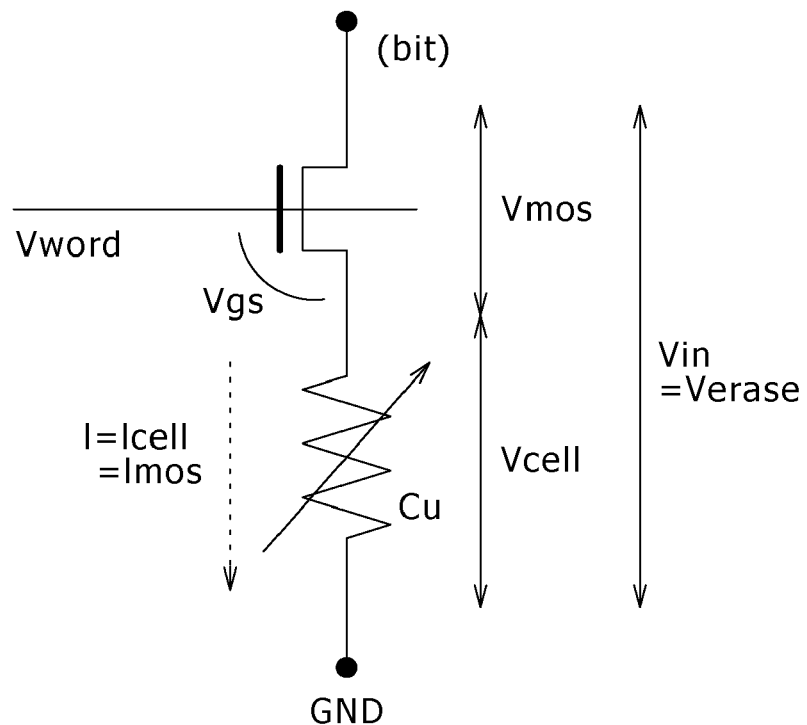
FIG. 10A is a schematic diagram (2) of assistance in explaining an operation of erasing a memory element.

As shown in FIG. 10A, when the voltage Vin is applied to one terminal of the MOS transistor, and the ground potential GND is applied to one terminal of the memory element, the source voltage of the MOS transistor at a time of an erasure operation is the voltage Vcell, so that for the effective gate voltage Vgs of the MOS transistor, a relation Vgs=Vword−Vcell holds. However, when the voltage Vcell is increased and the effective gate voltage Vgs approaches the threshold value voltage Vth_mos, a voltage equal to or higher than (Vin−Vth_mos) may not be applied to the MOS transistor. That is, when the voltage Vcell is increased, the effective gate voltage Vgs becomes relatively low. When the effective gate voltage Vgs approaches the threshold value voltage Vth_mos, the MOS transistor is brought into an off state, so that no current flows through the memory cell and no voltage is applied to the memory element. Thus, when the voltage Vin is applied to one terminal of the MOS transistor, consideration needs to be given not only to the cases where the above-described MOS transistor operates in a saturation region or a non-saturation region but also to the fact that no voltage is applied to the memory element when the voltage Vcell is increased and the effective gate voltage Vgs approaches the threshold value voltage Vth_mos.

Figure 10B:
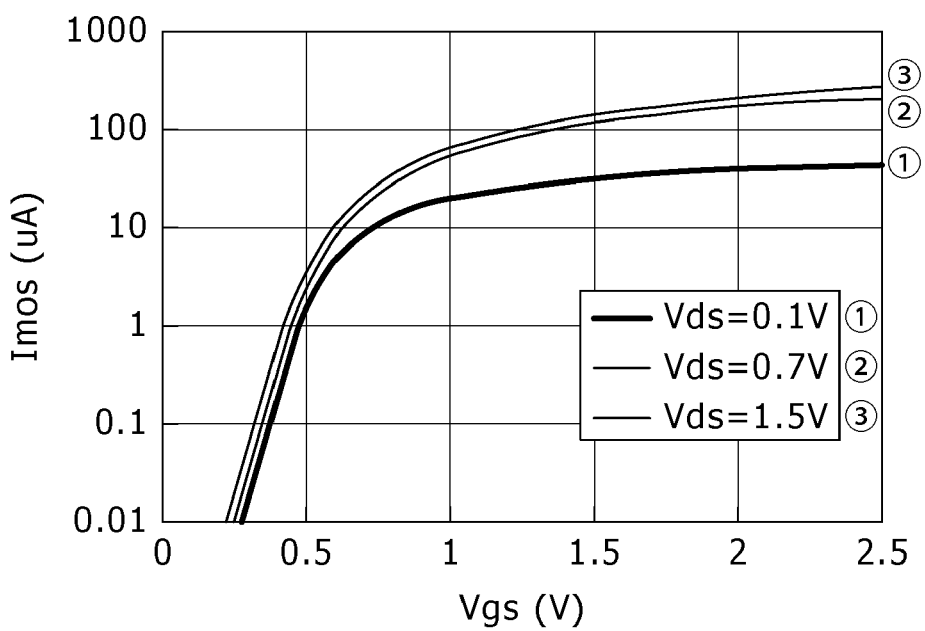
FIG. 10B is a graph showing relations between voltage Vgs and current Imos.

Incidentally, with the configuration of the memory cell shown in FIG. 10A, the gate voltage Vword is a Vcell-to-gate voltage, and the gate voltage Vword is thus dependent on the voltage Vcell. The effective gate voltage Vgs and the current Imos have a relation as shown in FIG. 10B.

Figure 10C:
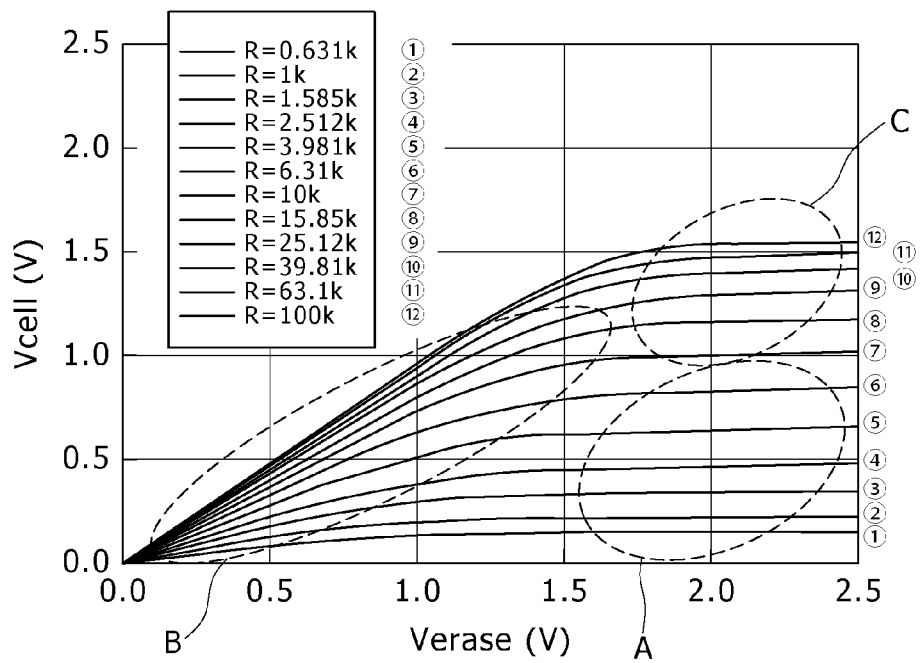
FIG. 10C is a graph (2) showing relations between voltage Verase and voltage Vcell.

FIG. 10C shows relations between the voltage Verase and the voltage Vcell when the resistance value of the memory element after writing is 0.631 kΩ, 1 kΩ, 1.585 kΩ, 2.512 kΩ, 3.981 kΩ, 6.31 kΩ, 10 kΩ, 15.85 kΩ, 25.12 kΩ, 39.81 kΩ, 63.1 kΩ, and 100 kΩ. Incidentally, a symbol A in FIG. 10C denotes the saturation region of the above-described MOS transistor. A symbol B in FIG. 10C denotes the non-saturation region of the above-described MOS transistor. A symbol C in FIG. 10C denotes a region where a maximum value of the voltage Vcell is limited to Vin−Vth_mos as the effective gate voltage Vgs approaches the voltage Vth.

It is understood from FIG. 10C that when a predetermined voltage Vin is applied, the higher the resistance value of the memory element after writing, the higher the voltage Vcell.

As described above, it is understood that in both the case of applying a predetermined voltage Vin to one terminal of the memory element and the case of applying a predetermined voltage Vin to one terminal of the MOS transistor, the higher the resistance value of the memory element after writing, the higher the voltage Vcell.

It can thus be said that under a precondition that the current Icell is limited to the current Imos, the resistance value of the memory element after writing needs to be Vth_erase/Imos or higher to apply the voltage Vcell equal to or higher than the erasure voltage threshold value Vth_erase at the time of the erasure operation.

Description will be made below of methods for controlling the resistance value of the memory element after writing to a sufficiently high value so that the erasure operation can be surely performed.

(First Method for Controlling Resistance Value of Memory Element after Writing)

Figure 11:
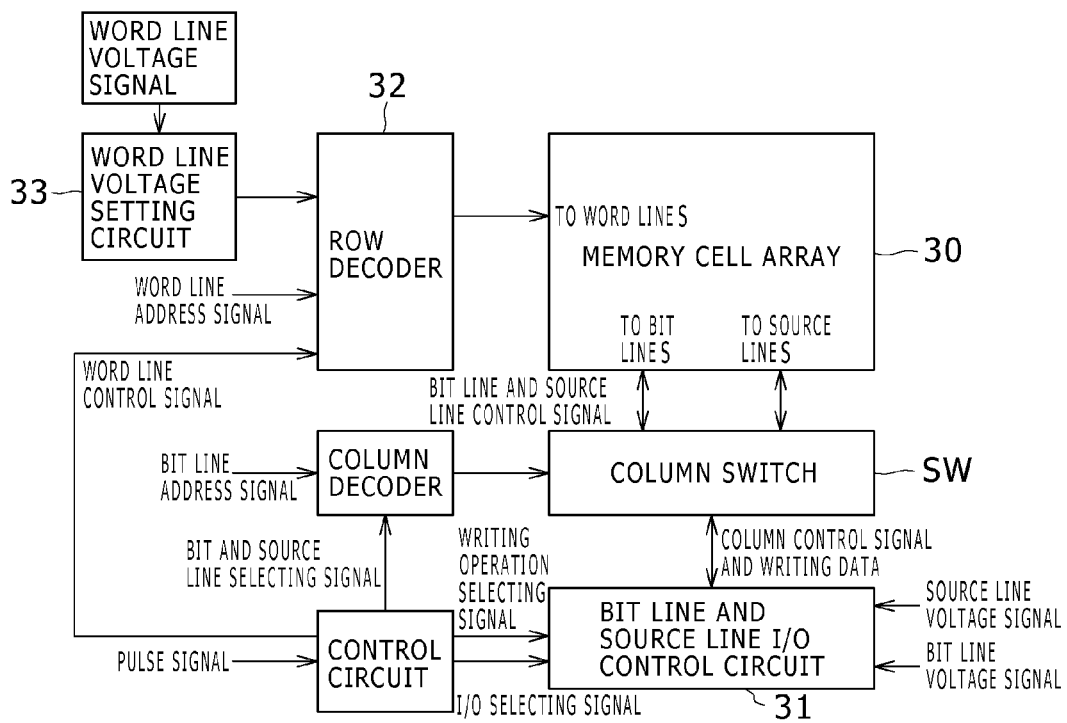
FIG. 11 is a schematic diagram of assistance in explaining an example of a writing resistance control circuit for controlling the resistance value of a memory element after writing.

FIG. 11 is a schematic diagram of assistance in explaining an example of a writing resistance control circuit for controlling the resistance value of a memory element after writing. In the writing resistance control circuit shown in FIG. 11, bit lines and source lines of a memory cell array 30 as shown in FIGS. 4 to 7 are connected to an input-output control circuit (I/O control circuit) 31 via a column switch SW, and word lines of the memory array are connected to a row decoder 32 as a word line voltage controlling circuit. The row decoder 32 is connected with a word line voltage setting circuit 33. Voltage applied to the word lines can be controlled by the word line voltage setting circuit.

The writing resistance control circuit formed as described above is used to limit the voltage of a word line connected to the gate of a MOS transistor in a memory cell, that is, to set an upper limit value to the voltage applied to the word line and thereby limit an amount of current flowing through a memory element, whereby the resistance value of the memory element after writing can be set to a value sufficiently high to surely perform the erasure operation.

Incidentally, the upper limit value of the voltage applied to the word line may be arbitrarily controlled by a user of the storage device from the outside of the device, or a circuit for controlling the voltage applied to the word line may be provided within the device.

(Second Method for Controlling Resistance Value of Memory Element after Writing)

Figure 12:
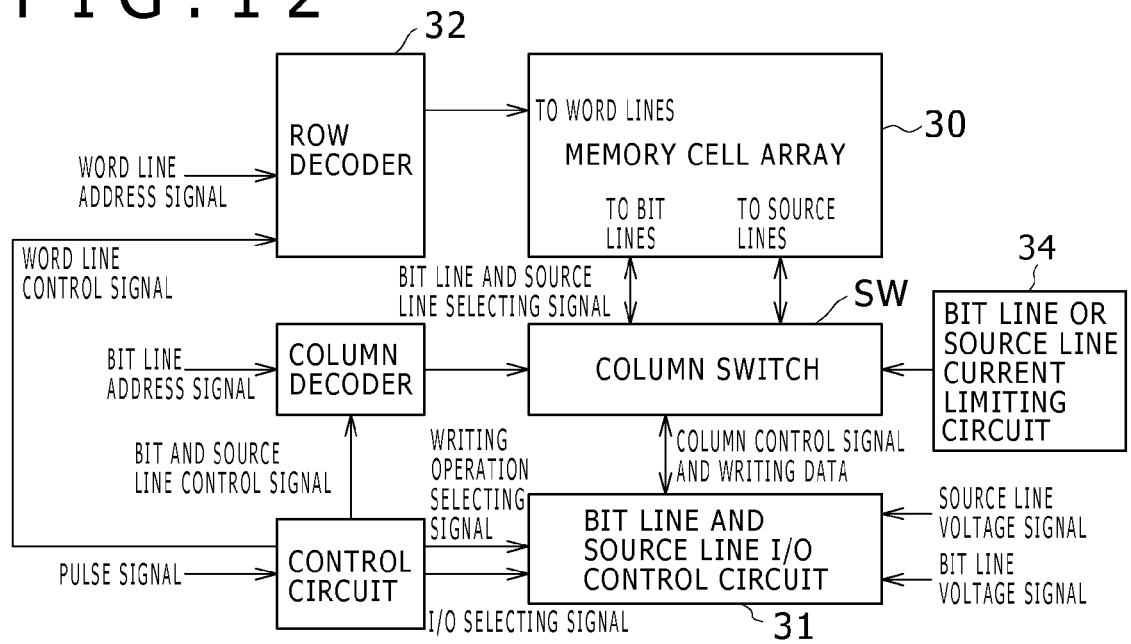
FIG. 12 is a schematic diagram of assistance in explaining another example of a writing resistance control circuit for controlling the resistance value of a memory element after writing.

FIG. 12 is a schematic diagram of assistance in explaining another example of a writing resistance control circuit for controlling the resistance value of a memory element after writing. As in the above-described example of the writing resistance control circuit, in the writing resistance control circuit shown in FIG. 12, bit lines and source lines of a memory cell array 30 as shown in FIGS. 4 to 7 are connected to an I/O control circuit 31 via a column switch SW, and word lines of the memory array are connected to a row decoder 32 as a word line voltage controlling circuit. In this case, the column switch is connected with a current limiting circuit 34. Current flowing through the bit lines or the source lines can be controlled by the current limiting circuit.

The writing resistance control circuit formed as described above is used to limit the current flowing through the bit lines or the source lines, that is, to control an upper limit value of an amount of current flowing at a time of writing a memory element, whereby the resistance value of the memory element after writing can be set to a value sufficiently high to surely perform the erasure operation.

Incidentally, the second method for controlling the resistance value of the memory element after writing may of course be used in combination with the first method for controlling the resistance value of the memory element after writing.

(Third Method for Controlling Resistance Value of Memory Element after Writing)

It is known that after a memory element is written once and the memory element is thus set in a conduction state, the resistance value of the memory element does not become high even when rewriting is performed with a current having a current value lower than in the first writing, whereas the resistance value of the memory element becomes low when rewriting is performed with a current having a current value higher than in the first writing (see Japanese Patent Application No. 2005-199799, for example).

Accordingly, it is possible to set the resistance value of the memory element after writing to a value sufficiently high to surely perform the erasure operation by repeating writing operation while gradually increasing the upper limit value of voltage applied to word lines in a writing resistance control circuit as in the above-described first method for controlling the resistance value of the memory element after writing, or while gradually increasing the maximum value of an amount of current permitted in a current limiting circuit as in the above-described second method for controlling the resistance value of the memory element after writing, after a writing resistance value higher than a target setting value is set first.

A concrete sequence will be described below with reference to FIG. 13. Incidentally, Rcell denotes the resistance value of the memory element, Rinit denotes the resistance value of the memory element after initial writing, and Rtarget denotes a target setting value (a resistance value that enables erasure operation to be surely performed).

Figure 13:
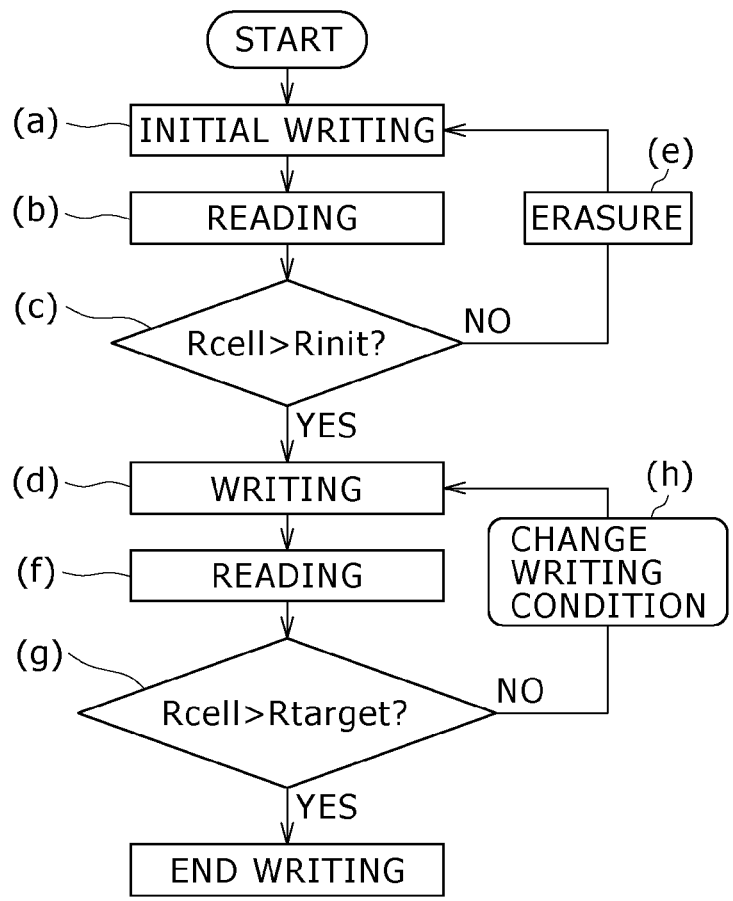
FIG. 13 is a flowchart of assistance in explaining a method of setting the resistance value of a memory element after writing.

In the concrete sequence, initial writing is performed first (see (a) in FIG. 13). Incidentally, initial rewriting to be described later may not be performed unless the resistance value Rinit is equal to or higher than a lower limit resistance value as a lower limit of a resistance value that allows erasure operation. Therefore the initial writing needs to be performed such that the memory element after the writing has a resistance value equal to or higher than the lower limit resistance value.

Next, reading is performed to measure the resistance value of the memory element after the initial writing (see (b) in FIG. 13). The resistance value Rcell is compared with the resistance value Rinit ((c) in FIG. 13). When a relation Rcell>Rinit is satisfied, writing as a next step is performed (see (d) in FIG. 13). On the other hand, when a relation Rcell>Rinit is not satisfied, erasure operation is performed (see (e) in FIG. 13). Then initial rewriting is performed.

Next, reading is performed, whereby a relation Rcell>Rinit is satisfied, and the resistance value of the written memory element is measured (see (f) in FIG. 13). The resistance value Rcell is compared with the target setting value Rtarget (see (g) in FIG. 13). When a relation Rcell=Rtarget is satisfied, the writing process is ended. On the other hand, when the relation Rcell=Rtarget is not satisfied, a writing condition is changed (for example the upper limit value of the voltage applied to the word lines in the writing resistance control circuit is changed, or the maximum value of the amount of current permitted in the current limiting circuit is changed) (see (h) in FIG. 13). Thereafter the sequence of writing, reading, and comparison is repeated.

The sequence as described above can set the resistance value of the memory element after writing to a value sufficiently high to surely perform erasure operation.

(Fourth Method for Controlling Resistance Value of Memory Element after Writing)

Figure 14:
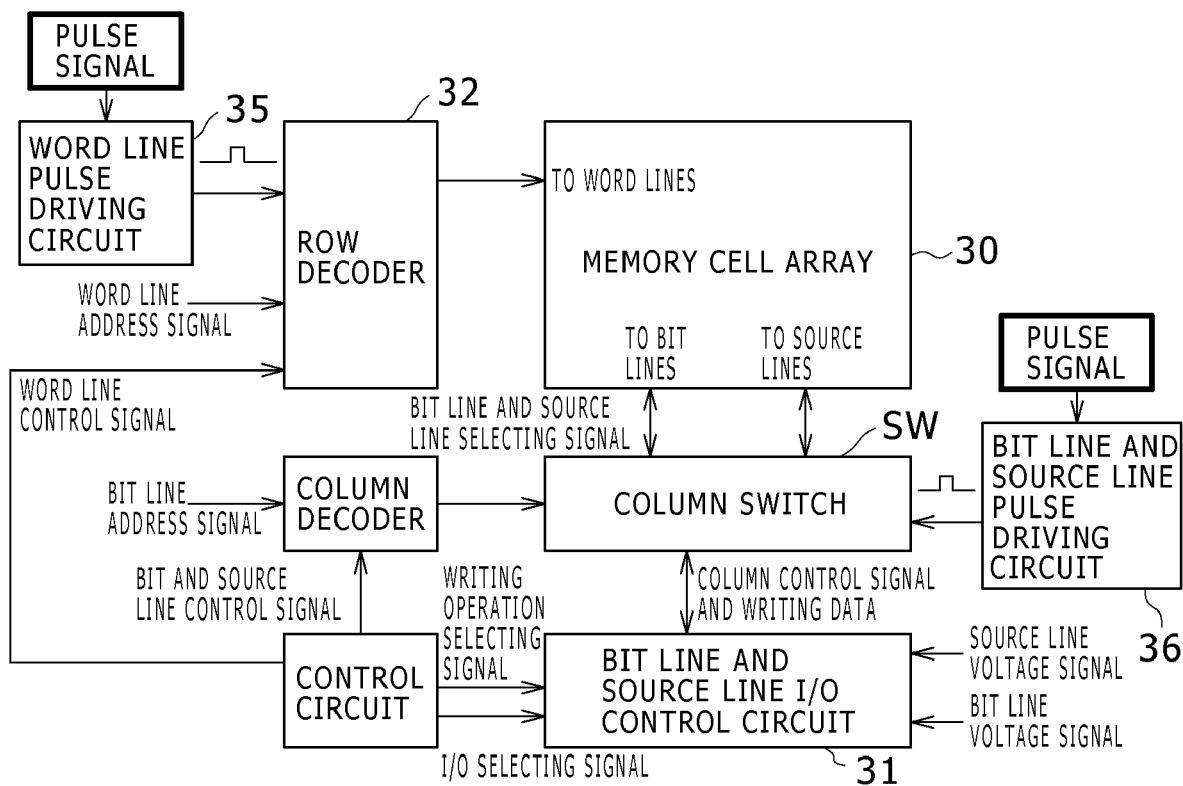
FIG. 14 is a schematic diagram of assistance in explaining yet another example of a writing resistance control circuit for controlling the resistance value of a memory element after writing.

FIG. 14 is a schematic diagram of assistance in explaining yet another example of a writing resistance control circuit for controlling the resistance value of a memory element after writing. As in the above-described example of the writing resistance control circuit and the other example of the writing resistance control circuit, in the writing resistance control circuit shown in FIG. 14, bit lines and source lines of a memory cell array 30 as shown in FIGS. 4 to 7 are connected to an I/O control circuit 31 via a column switch SW, and word lines of the memory array are connected to a row decoder 32 as a word line voltage controlling circuit. In this case, the column switch and the row decoder are respectively connected with a bit line and source line pulse driving circuit 36 and a word line pulse driving circuit 35. Pulse signals applied to the word lines and the bit lines or the source lines can be controlled by the pulse driving circuits.

The writing resistance control circuit formed as described above is used to set an upper limit value to the width of a writing pulse for activating the word lines and the bit lines or the source lines, that is, to limit a total amount of current flowing into a memory element, whereby the resistance value of the memory element after writing can be set to a value sufficiently high to surely perform the erasure operation.

In the storage devices to which the present invention is applied, the resistance value of the memory element after writing is controlled by the control methods as described above, and the resistance value of the memory element after writing is made to be a high resistance value such that a voltage equal to or higher than the erasure voltage threshold value is applied to the memory element at the time of erasure operation. It is therefore possible to surely perform erasure.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device comprising:
a memory cell having a storage element; and
a transistor element in saturation connected in series with said storage element,
wherein,
the memory cell resistance changes from a state of high resistance to a state of low resistance when a voltage equal to or higher than a first threshold voltage is applied in a writing operation,
the memory cell resistance changes from a state of low resistance to a state of high resistance when a voltage equal to or higher than a second threshold voltage with a different polarity than the first threshold value is applied in an erasure operation, and
the resistance value of said storage element after said writing operation is set to a value at least equal to the ratio between said second threshold voltage and a maximum current that can be passed through said transistor element in saturation in said erasure operation.

2. The storage device as claimed in claim 1, wherein:
said transistor element in saturation is a unipolar transistor; and
the current that can be passed through said storage element at a time of erasure is a saturation current of said unipolar transistor.

3. The storage device as claimed in claim 1, wherein:
said transistor element in saturation is a unipolar transistor; and
the current that can be passed through said storage element at a time of erasure is a maximum value of a drain current of said unipolar transistor when said second threshold voltage is applied to said storage element.

4. A storage device comprising:
a plurality of memory cells each having a storage element formed by interposing a storage layer between a first electrode layer and a second electrode layer; and
a transistor element in saturation connected in series with said storage element,
wherein,
the storage element changes from a state of high resistance to a state of low resistance when a voltage equal to or higher than a first threshold voltage is applied between the fist and second electrode layers during a writing operation,
the storage element changes from a state of low resistance to a state of high resistance when a voltage equal to or higher than a second threshold voltage with a polarity different than the first threshold voltage is applied during an erasure operation, and the resistance of said storage element after writing is set to a value at least equal to the ratio between said second threshold voltage and a maximum current that can be passed through said transistor element in saturation at a time of erasure.

5. The storage device as claimed in claim 4, wherein:
said transistor element in saturation is a unipolar transistor; and
the current that can be passed through said storage element at a time of erasure is a saturation current of said unipolar transistor.

6. The storage device as claimed in claim 4, wherein:
said transistor element in saturation is a unipolar transistor; and
the current that can be passed through said storage element at a time of erasure is a maximum value of a drain current of said unipolar transistor when said second threshold voltage is applied to said storage element.

7. The storage device as claimed in claims 4, wherein a common electrode layer forms at least one of the electrode layers of said memory cell.

8. A semiconductor device comprising:
a storage device including a memory cell;
a storage element included in the memory cell; and
a transistor element in saturation connected in series with said storage element,
wherein,
the storage element changes from a state of a high resistance to a state of a low resistance when supplied with a voltage equal to or higher than a first threshold voltage during a writing operation,
the storage element changes from a state of a low resistance to a state of a high resistance when supplied with a voltage equal to or higher than a second threshold voltage and different in polarity from said first threshold voltage during an erasure operation, and
a resistance value of said storage element after writing is set to a value at least equal to the ratio between said second threshold voltage and a maximum current that can be passed through said transistor element in saturation at a time of erasure.

9. The semiconductor device as claimed in claim 8, wherein a word line voltage setting circuit for limiting word line voltage forms a writing control circuit.

10. The semiconductor device as claimed in claim 8, wherein a current limiting circuit for limiting current flowing through one of a bit line or a source line forms a writing control circuit.

11. The semiconductor device as claimed in claim 8, wherein a writing control circuit is a pulse driving circuit for limiting pulse widths of pulse signals applied to a word line and one of a bit line or a source line.

12. A semiconductor device comprising:
a storage device including a plurality of memory cells;
each memory cell having a storage element formed by interposing a storage layer between a first electrode layer and a second electrode layer; and
a transistor element in saturation connected in series with said storage element,
wherein,
said storage element changes from a state of a high resistance to a state of a low resistance when a voltage equal to or higher than a first threshold voltage is applied between the first electrode layer and the second electrode layer during a writing operation,
said storage element changes from a state of a low resistance to a state of a high resistance when a voltage equal to or higher than a second threshold voltage and different in polarity from said first threshold voltage is applied during an erasure operation, and
a resistance value of said storage element after writing is set to a value at least equal to the ratio between said second threshold voltage and a maximum current that can be passed through said transistor element in saturation at a time of erasure.

13. The semiconductor device as claimed in claim 12, wherein a word line voltage setting circuit for limiting word line voltage forms a writing control circuit.

14. The semiconductor device as claimed in claim 12, wherein a current limiting circuit for limiting current flowing through one of a bit line or a source line forms a writing control circuit.

15. The semiconductor device as claimed in claim 12, wherein a writing control circuit is a pulse driving circuit for limiting pulse widths of pulse signals applied to a word line and one of a bit line or a source line.

16. The semiconductor device as claimed in claims 12, wherein a common electrode layer forms at least one of the electrode layers of said memory cell.

* * * * *